(12) United States Patent
Kwon

(10) Patent No.: US 11,784,083 B2
(45) Date of Patent: Oct. 10, 2023

(54) PAD STRUCTURE FOR TRANSFERRING FLAT PANEL

(71) Applicant: G-NONE.Co.Ltd., Suwon-si (KR)

(72) Inventor: Jae Cheon Kwon, Suwon-si (KR)

(73) Assignee: G-NONE.Co.Ltd., Suwon-si (KR)

(*) Notice: Subject to any disclaimer, the term of this patent is extended or adjusted under 35 U.S.C. 154(b) by 272 days.

(21) Appl. No.: 17/405,528

(22) Filed: Aug. 18, 2021

(65) Prior Publication Data

US 2022/0115258 A1  Apr. 14, 2022

(30) Foreign Application Priority Data

Oct. 11, 2020  (KR) .................. 10-2020-0130746

(51) Int. Cl.
| | |
|---|---|
| *H01L 21/683* | (2006.01) |
| *H01L 21/67* | (2006.01) |
| *C09J 7/20* | (2018.01) |
| *H01L 21/687* | (2006.01) |

(52) U.S. Cl.
CPC .......... *H01L 21/6836* (2013.01); *C09J 7/20* (2018.01); *H01L 21/67294* (2013.01); *C09J 2203/326* (2013.01); *C09J 2301/31* (2020.08); *C09J 2483/006* (2013.01); *H01L 21/6875* (2013.01); *H01L 21/68707* (2013.01); *H01L 2221/68318* (2013.01); *H01L 2221/68381* (2013.01)

(58) Field of Classification Search
CPC .......... H01L 21/6836; H01L 21/67294; H01L 21/68707; H01L 21/6875; H01L 2221/68318; H01L 2221/68381; C09J 7/20; C09J 2203/326; C09J 2301/31; C09J 2483/006; B65G 47/91; B65G 49/06; B65G 49/063; B65G 2201/022; B65G 2249/045; B25J 15/0691

See application file for complete search history.

(56) References Cited

U.S. PATENT DOCUMENTS

| | | | | |
|---|---|---|---|---|
| 2010/0252177 A1* | 10/2010 | Sargent | ............ | C09J 7/00 428/156 |
| 2012/0052234 A1* | 3/2012 | Natarajan | ............ | B29C 33/424 73/105 |

FOREIGN PATENT DOCUMENTS

| | | |
|---|---|---|
| JP | 2001-223252 A | 8/2001 |
| KR | 10-1553826 B1 | 9/2015 |
| KR | 10-1619876 B1 | 5/2016 |

(Continued)

*Primary Examiner* — Patricia L. Nordmeyer
(74) *Attorney, Agent, or Firm* — NKL LAW; Jae Youn Kim

(57) ABSTRACT

Disclosed is a pad structure for transferring a flat panel that includes a circular adhesive force adjustment pattern having a predetermined diameter in the center of the pad body, and a ring-shaped microciliated member having a circumferential surface surrounding the first adhesive force adjustment pattern and including a plurality of cilia spaced apart from one another, and thus provides advantages of improving the adhesive force per unit area due to the functions of the pad, without a separate vacuum device, of being easily and simply attached to and detached from the blade at a desired position thereon, and of maximizing productivity by easily and smoothly performing quality control, preventive maintenance, and inventory management of the pad for transferring a flat panel based on serial number standardization (product information standardization).

14 Claims, 7 Drawing Sheets

(56) References Cited

FOREIGN PATENT DOCUMENTS

KR       10-1983674 B1    5/2019
KR    2020-0043341 A    4/2020

* cited by examiner

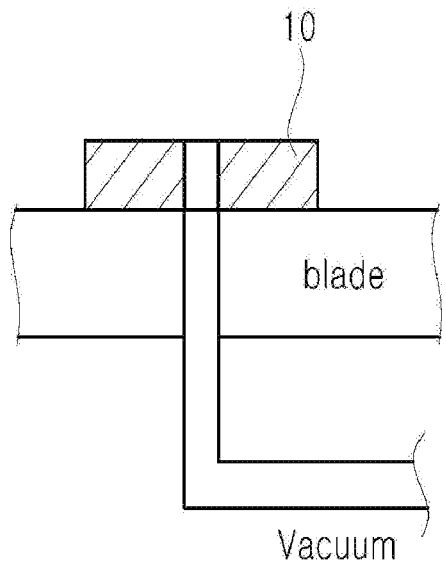
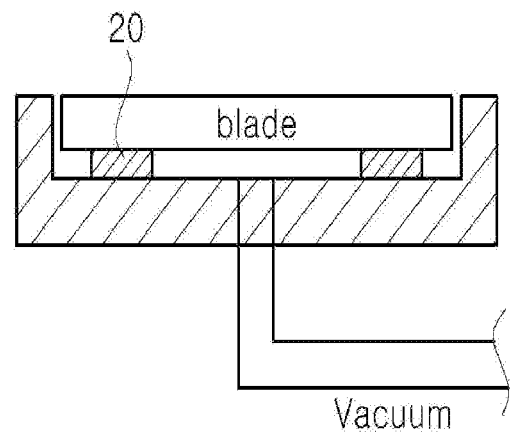
FIG. 1A PRIOR ART
FIG. 1B PRIOR ART
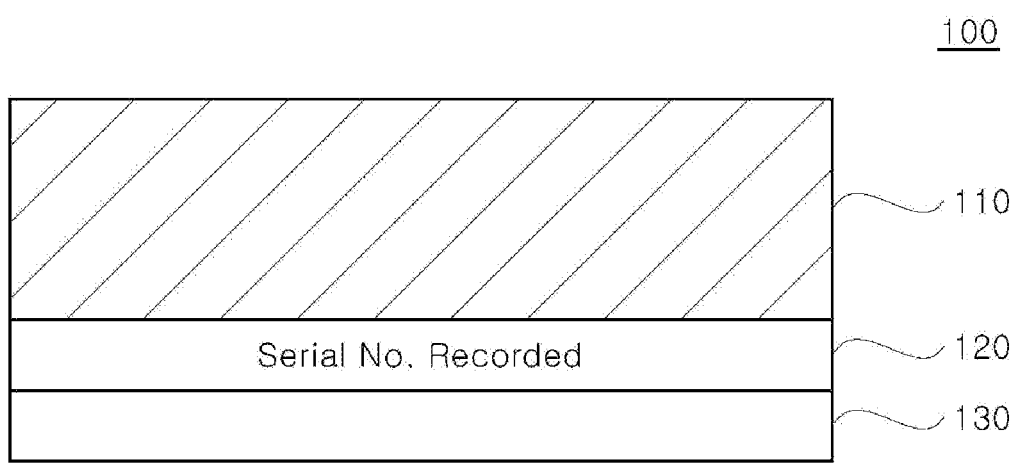
FIG. 2

PAD STRUCTURE FOR TRANSFERRING FLAT PANEL

CROSS-REFERENCE TO RELATED APPLICATIONS

This application claims priority to and the benefit of Korean patent application No. 10-2020-0130746 filed on Oct. 11, 2020, the disclosure of which is incorporated herein by reference in its entirety.

BACKGROUND OF THE INVENTION

Field of the Invention

The present invention relates to a pad structure for transferring a flat panel, and more particularly to a pad structure for transferring a flat panel that includes a circular adhesive force adjustment pattern having a predetermined diameter in the center of the pad body, and a ring-shaped microciliated member having a circumferential surface surrounding the first adhesive force adjustment pattern and including a plurality of cilia spaced apart from one another, and thus is capable of improving the adhesive force per unit area due to the functions of the pad, without a separate vacuum device, and of being easily and simply attached to and detached from the blade at a desired position thereon.

Description of the Related Art

Conventional transfer pads that are combined with a blade includes a vacuum-holding type and a pocket type.

FIGS. 1A-1B illustrate a conventional transfer pad combined with a blade.

As shown in FIG. 1A, the vacuum-holding type involves picking up and transferring an object by generating a vacuum, and has a structure in which the transfer pad is attached to the blade by a vacuum.

Such a vacuum-holding type may have problems in that the transfer pad 10 may be damaged by the vacuum supply device, additional cost associated with the component is incurred, and the transfer pad may become so strongly adhered to the surface of the transferred object that it becomes impossible to separate the transfer pad therefrom.

As shown in FIG. 1B, the pocket type employs a transfer method in which the blade to which the transfer pad 20 is attached is mounted in a pocket-shaped device. The pocket type has a problem in that the transferred object or the transfer pad 20 is scratched or cracked when the blade shakes during transfer and applies an impact to the inner wall of the pocket-type device.

In addition, the conventional transfer pads are problematic in that they are frequently neglected because they are very small components that are commonly installed in great numbers at production sites, so transferred objects are often contaminated or damaged, and facility downtime due to consequent replacement thereof may reduce productivity.

RELATED ART

Patent Literature (Patent Literature 1) Korean Patent Publication Laid-open No. 2020-0043341

SUMMARY OF THE INVENTION

Therefore, the present invention has been made in view of the above problems, and it is an object of the present invention to provide a pad structure for transferring a flat panel that includes a circular adhesive force adjustment pattern having a predetermined diameter in the center of the pad body and a ring-shaped microciliated member having a circumferential surface surrounding the first adhesive force adjustment pattern and including a plurality of cilia spaced apart from one another, and thus is capable of improving the adhesive force per unit area due to the functions of the pad, and of improving productivity through easy management and installation.

In accordance with the present invention, the above and other objects can be accomplished by the provision of a pad structure for transferring a flat panel including a pad for transferring a flat panel, the pad for transferring a flat panel including a pad body having a disk shape having a predetermined diameter and height and a contact portion formed on the pad body and having a predetermined adhesive force suitable for holding an object to be transferred and for enabling separation of the object, a first adhesive tape having a first surface including an adhesive layer, the first surface bonded to one surface of the pad body, and a second adhesive tape in a form of a double-sided tape including a first adhesive layer and a second adhesive layer on respective surfaces thereof, the first adhesive layer bonded to the first adhesive tape and the second adhesive layer bonded to a blade, wherein the contact portion includes a first adhesive force adjustment pattern having a circular shape having a predetermined diameter and formed so as to be flat in a center of the pad body, and a microciliated member having a ring shape having a circumferential surface surrounding the first adhesive force adjustment pattern, the microciliated member including a plurality of cilia spaced apart from one another to increase an adhesive force per unit area.

In accordance with another aspect of the present invention, there is provided a pad structure for transferring a flat panel including a pad for transferring a flat panel, the pad for transferring a flat panel including a pad body having a disk shape having a predetermined diameter and height and a contact portion formed on the pad body and having a predetermined adhesive force suitable for holding an object to be transferred and for separation of the object, a first adhesive tape having a first surface including an adhesive layer, the first surface bonded to one surface of the pad body, and a second adhesive tape in a form of a double-sided tape including a first adhesive layer and a second adhesive layer on respective surfaces thereof, the first adhesive layer bonded to the first adhesive tape and the second adhesive layer bonded to a blade, wherein the contact portion includes a second adhesive force adjustment pattern having a circular shape having a predetermined diameter provided in a form of a depression in a center of the pad body, and a microciliated member having a ring shape having a circumferential surface surrounding the second adhesive force adjustment pattern, the microciliated member including a plurality of cilia spaced apart from one another to increase an adhesive force per unit area.

The pad for transferring a flat panel may be formed of a transparent silicon-based material.

The diameter of each of the first adhesive force adjustment pattern and the second adhesive force adjustment pattern may be determined depending on the size of the object to be transferred.

The pad structure for transferring a flat panel may further include a base plate having one surface bonded to the second adhesive layer of the second adhesive tape, the base plate having a predetermined height and a flat shape, and adjusting the flatness by controlling the height of the pad for transferring a flat panel, and a third adhesive tape in the form of double-sided tape including a third adhesive layer and a fourth adhesive layer on respective surfaces thereof, the third adhesive layer bonded to one surface of the base plate, and the fourth adhesive layer bonded to a blade.

The first surface of the first adhesive tape, including the adhesive layer, may be attached to one surface of the pad body, and product information including a serial number may be printed on a second surface opposite the first surface.

BRIEF DESCRIPTION OF THE DRAWINGS

The above and other objects, features and other advantages of the present invention will be more clearly understood from the following detailed description taken in conjunction with the accompanying drawings, in which:

FIGS. 1A-1B illustrate a conventional transfer pad combined with a blade;

FIG. 2 illustrates the configuration of a pad structure for transferring a flat panel according to a first embodiment of the present invention;

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

It will be further understood that the term "comprises", when used in this specification, specifies the presence of elements, but does not preclude the presence or addition of one or more other elements, unless specified otherwise.

Figure 3:
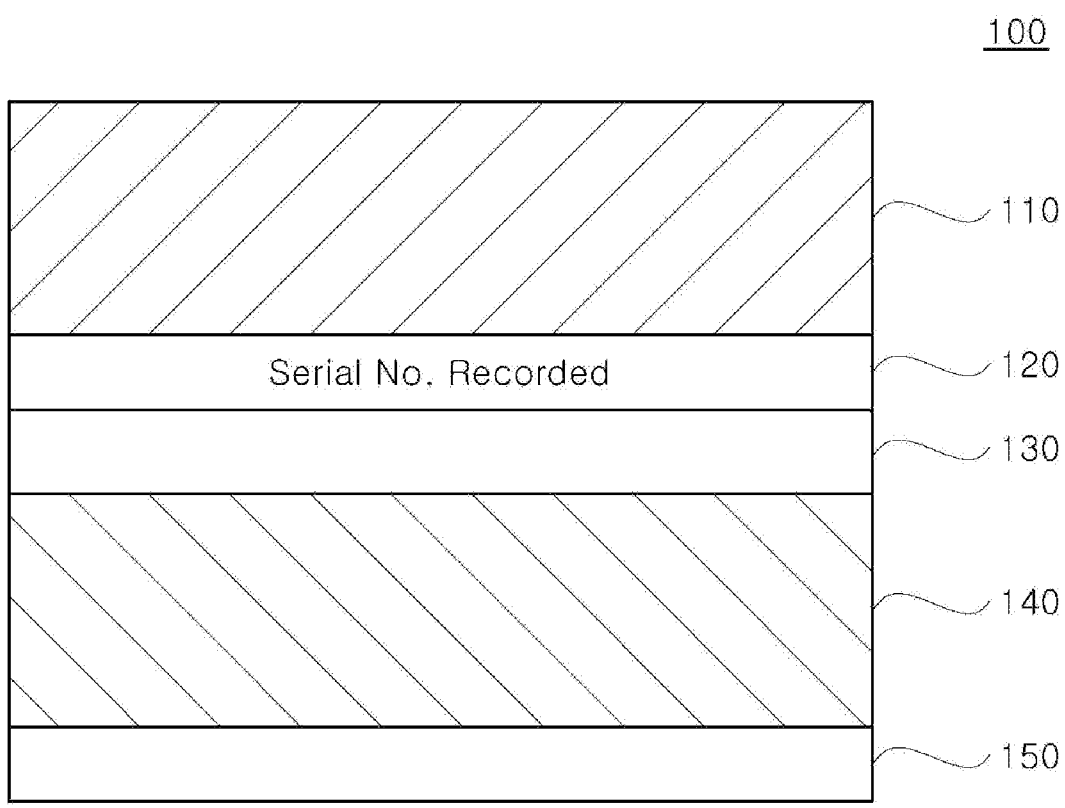
FIG. 3 illustrates the configuration of a pad structure for transferring a flat panel according to a second embodiment of the present invention.
Figure 4A:
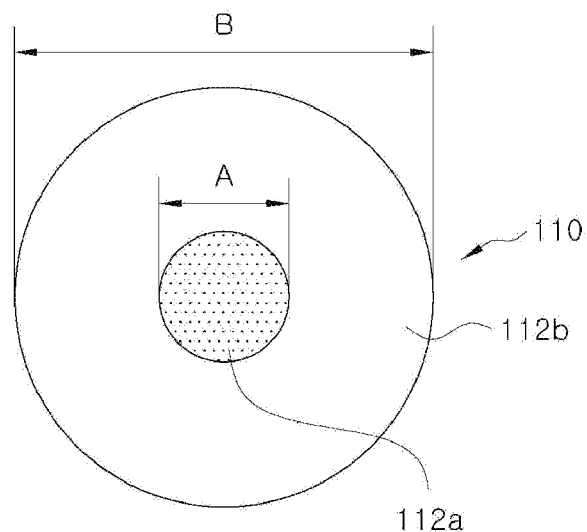
FIGS. 4A-4B illustrate the configuration of a pad for transferring a flat panel according to a first embodiment of the present invention.
Figure 4B:
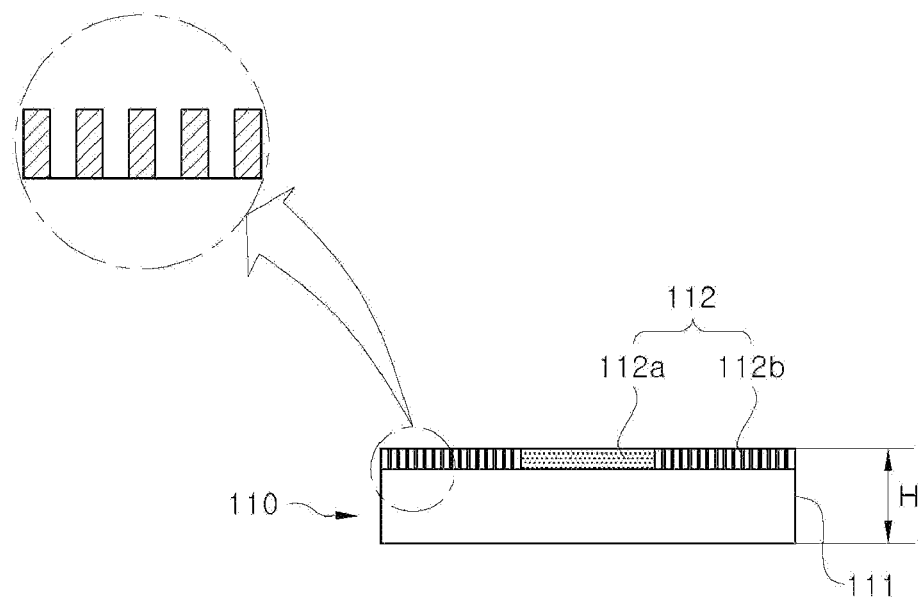
Figure 5A:
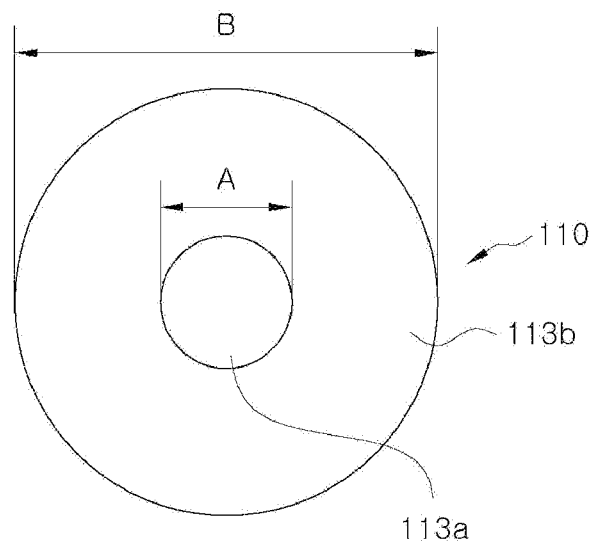
FIGS. 5A-5B illustrate the configuration of a pad for transferring a flat panel according to a second embodiment of the present invention.
Figure 5B:
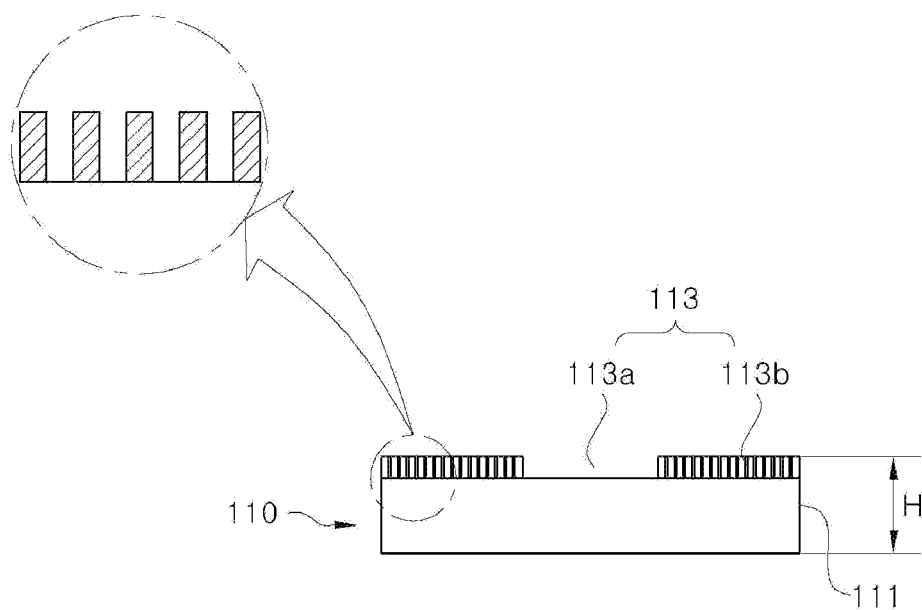

FIG. 2 illustrates the configuration of a pad structure for transferring a flat panel according to a first embodiment of the present invention, FIG. 3 illustrates the configuration of a pad structure for transferring a flat panel according to a second embodiment of the present invention, FIGS. 4A-4B illustrate the configuration of a pad for transferring a flat panel according to a first embodiment of the present invention, and FIGS. 5A-5B illustrate the configuration of a pad for transferring a flat panel according to a second embodiment of the present invention.

As shown in FIG. 2, the pad structure for transferring a flat panel according to the first embodiment of the present invention is accomplished by stacking and binding a pad for transferring a flat panel 110, a first adhesive tape 120, and a second adhesive tape 130.

The pad for transferring a flat panel 110 has a disk shape having a predetermined diameter and height, can be used in a temperature range of −40° C. to 260° C., and is made of a milky white (transparent) silicon-based material having uniform physical properties.

The pad for transferring a flat panel 110 includes a disk-shaped pad body 111 having a predetermined diameter and height, and a contact portion 112 that is formed on the pad body 111 and has a predetermined adhesive force appropriate to hold an object to be transferred but low enough for removal of the object.

The pad for transferring a flat panel 110 has a diameter B of 10 mm and a height H of 0.5 to 3.0 mm.

The contact portion 112 has a structure for adhering to the object to be transferred and separating from the object to be transferred safely and easily upon contacting the object. Here, the object to be transferred may be a flat panel, including a semiconductor wafer, a glass plate, or the like.

As shown in FIGS. 4A-4B, in the first embodiment of the pad for transferring a flat panel, the contact portion 112 includes a circular first adhesive force adjustment pattern 112a having a predetermined diameter in the center of the pad body 111 and a microciliated member 112b having a ring shape having a circumferential surface surrounding the first adhesive force adjustment pattern 112a. The pad body 111, the first adhesive force adjustment pattern 112a, and the microciliated member 112b are integrally formed from a single piece of material.

The first adhesive force adjustment pattern 112a and microciliated member 112b have the same height from one surface that contacts the object to be transferred (flat panel).

The microciliated member 112b has a columnar cross-sectional shape, the cilia are spaced apart from one another, and each cilium has a rectangular shape when viewed from the side and may have a columnar shape having any of various cross-sectional shapes such as cylindrical, triangular, quadrangular, polygonal, elliptical, and circular shapes.

As another embodiment, the adhesive force can be improved by forming the tip of the cilia in the form of gecko spatulae.

The microcilia member 112b provides an adhesive force per area derived from the theory of van der Waals force, and thereby physically functions to improve the adhesive force for transferring an object.

The microciliated member 112b provides a partial space and generates a vacuum force, thereby increasing the adhesive force compared to when the object is adhered to a basic cilia structure.

The specifications of the microciliated member 112b may be changed as needed depending on the size, weight, and size of the flat panel loaded as the object to be transferred, and the height may be 20 to 50 μm, the diameter may be 20 to 80 μm, and the distance from the center of one cilium to the center of another cilium may be 70 to 150 μm.

The required adhesive force and safe separability with regard to the object to be transferred are both realized by the microciliated member 112b of the pad for transferring a flat panel 110.

The first adhesive force adjustment pattern 112a is a cilium-free portion, and provides physical adhesion comparable to the base material.

The diameter A of the first adhesive force adjustment pattern 112a is 2 to 4 mm, and may be determined depending on the size of the transfer object (flat panel) to be loaded thereon.

When the object to be transferred is a wafer having a diameter of 300 mm, the diameter of the first adhesive force adjustment pattern 112a is adjusted to 2 mm, when the object is a wafer having a diameter of 200 mm, the diameter of the first adhesive force adjustment pattern 112a is adjusted to 3 mm, and when the object is flat glass, the diameter of the first adhesive force adjustment pattern 112a is adjusted to 4 mm.

The first adhesive force adjustment pattern 112a further increases the adhesive force, in addition to the adhesive force of the microciliated member 112b.

Separation of the object from the pad for transferring a flat panel 110 is naturally accomplished by air entering the microciliated member 112b.

A method of manufacturing the pad for transferring a flat panel 110 according to the first embodiment includes molding a microciliated member 112b and a first adhesive force adjustment pattern 112a into a die (e.g., semiconductor wafer) material through a semiconductor-pattern-forming method, casting a liquid milky white (transparent) silicone-based material thereto to form the microciliated member 112b and the first adhesive force adjustment pattern 112a, and setting the total height and overall shape of the pad for transferring a flat panel 110. Here, the semiconductor-pattern-forming method uses a known photomask process, and thus a detailed description thereof will be omitted.

The first adhesive tape 120 is attached to the surface of the pad body 111 on which the contact portion 112 is not formed.

The first surface of the first adhesive tape 120, on which the adhesive layer is formed, is attached to one surface of the pad body 111, and product information including a serial number is printed on the second surface, which is opposite the first surface.

The product information including the serial number printed on the second surface of the first adhesive tape 120 is essential information in order for the user to standardize management of the product for practical commercialization of the product, and enables clear management of history, such as the replacement cycle or warranty period of the pad for transferring the flat panel.

Therefore, the serial number of the first adhesive tape 120 has advantages of enabling easy and smooth quality control, preventive maintenance, and inventory management for the pad for transferring the flat panel, greatly contributing to managing the lifetime of the produced product and thereby improving productivity.

In addition, the serial number printed on the first adhesive tape 120 may be replaced with a barcode, or may be printed in combination with the barcode.

The second adhesive tape 130 is a double-sided tape on respective surfaces of which a first adhesive layer and a second adhesive layer are formed, wherein the first adhesive layer is bonded to the first adhesive tape 120, and the second adhesive layer is applied to a blade (or chuck) 101.

The first adhesive tape 120 and the second adhesive tape 130 are formed of a material having the same characteristics and the same conditions as the pad for transferring a flat panel 110, and include a film body and an adhesive agent, wherein the film body and the adhesive agent must not exhibit any physical or chemical change when exposed to a high-temperature environment (at −40 to 290° C.) for a long time.

As shown in FIG. 3, the pad structure for transferring a flat panel 100 according to the second embodiment of the present invention is realized by stacking and bonding a pad for transferring a flat panel 110, a first adhesive tape 120, a second adhesive tape 130, a base plate 140, and a third adhesive tape 150. The second embodiment will be described in detail, while excluding the description of the components of the pad for transferring a flat panel 110, the first adhesive tape 120, and the second adhesive tape 130 redundant with the first embodiment and focusing on differences therebetween.

The pad for transferring a flat panel 110 includes a disk-shaped pad body 111 having a predetermined diameter and height, and a contact portion 112 formed on the pad body 111 and having a predetermined adhesive force sufficient to hold an object to be transferred but low enough for removal of the object. As shown in FIG. 5, in the second embodiment of the pad for transferring the flat panel, the contact portion 113 has a depression in the center of the pad body 111, a second adhesive force adjustment pattern having a circular shape and a predetermined diameter, and a microciliated member 113b having a ring shape having a circumferential surface surrounding the adhesive force adjustment pattern.

The diameter of the second adhesive force adjustment pattern is 2 to 4 mm, and may be determined depending on the size of the transfer object (flat panel) to be loaded thereon.

When the object to be transferred is a wafer having a diameter of 300 mm, the diameter of the second adhesive force adjustment pattern is adjusted to 2 mm, when the object is a wafer having a diameter of 200 mm, the diameter of the second adhesive force adjustment pattern is adjusted to 3 mm, and when the object is flat glass, the diameter of the second adhesive force adjustment pattern is adjusted to 4 mm.

The second adhesive force adjustment pattern further increases an adhesive force using an air compression force of the depression, in addition to the adhesive force of the microciliated member 112b.

When the object (flat panel) to be transferred is loaded on the pad for transferring the flat panel 110, primary adhesive force is generated by the surface of the microciliated member 113b, the columnar shape of the microciliated member 113b is deformed by the weight of the object (flat panel), and, at the same time, the microciliated member 113b deformed immediately after the air escapes from the depression of the second adhesive force adjustment pattern 113a acts as a barrier film and generates a vacuum in the depression of the second adhesive force adjusting pattern 113a, thereby generating a secondary adhesive force (additional adhesive force).

In the second adhesive force adjustment pattern, the degree of compressive force may vary depending on the size of the depression.

The method of producing the contact portion 113 and the pad body 111 in the second embodiment of the pad for transferring the flat panel is the same as the method of producing the contact portion 113 and the pad body 111 in the first embodiment of the pad for transferring the flat panel, with the exception of the pattern of the contact portion, and thus a detailed description thereof will be omitted.

In addition, as shown in FIG. 3, the second adhesive tape 130 in the pad structure 100 for transferring the flat panel according to the second embodiment of the present invention is a double-sided tape on respective surfaces of which the first adhesive layer and the second adhesive layer are formed, wherein the first adhesive layer is bonded to the first adhesive tape 120 and the second adhesive layer is bonded to one surface of the base plate 140.

The base plate 140 has a flat shape and a predetermined height, and enables flatness to be adjusted by supplementing the height of the pad for transferring a flat panel 110.

The base plate 140 is made of polyether ether ketone (PEEK), poly imide (PI), or aluminum.

PEEK is used as a supplement for height adjustment to a thickness of 1 mm or less, and undergoes no physical or chemical change in the environment of the pad for transferring a flat panel 110 (at −50 to 340° C.).

PI is used as a supplement for height adjustment to a thickness of 1 mm or more, and undergoes no physical or chemical change in the environment of the pad for transferring a flat panel 110 (at −40 to 270° C.).

The third adhesive tape 150 is a piece of double-sided tape on respective surfaces of which a third adhesive layer and a fourth adhesive layer are formed, wherein the third adhesive layer is bonded to one surface of the base plate 140, and the fourth adhesive layer is applied to a blade (or chuck) 101.

In the pad structure for transferring a flat panel according to the second embodiment of the present invention, the base plate 140 and the third adhesive tape 150 may be sequentially bonded to the second adhesive tape 130 of the first embodiment.

That is, the contact portion 112 of the pad for transferring the flat panel according to the first embodiment of the present invention can be applied both to the pad structure 100 for transferring the flat panel of the first embodiment and to the pad structure 100 for transferring the flat panel of the second embodiment described above, and the contact portion 113 of the pad for transferring the flat panel according to the second embodiment of the present invention may also be applied to the pad structure 100 for transferring the flat panel according to the first embodiment and the second embodiment described above.

Figure 6A:
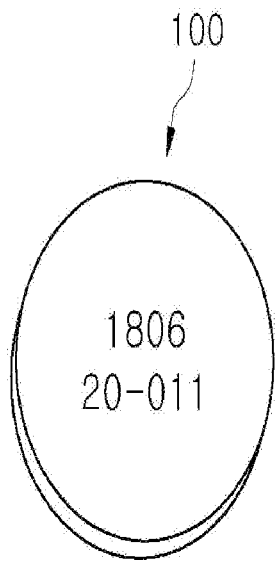
FIGS. 6A-6C illustrate an example of a pad structure for transferring a flat panel according to an embodiment of the present invention.
Figure 6B:
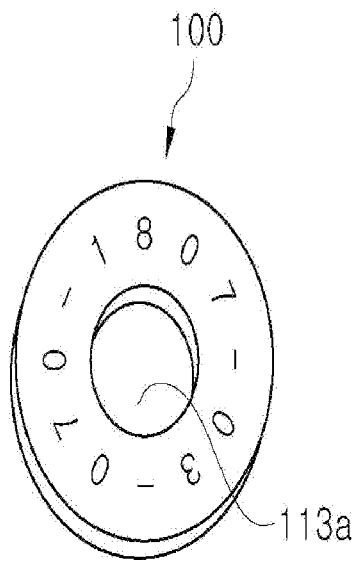
Figure 6C:
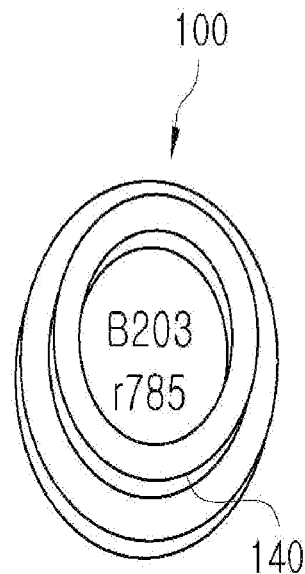
Figure 7:
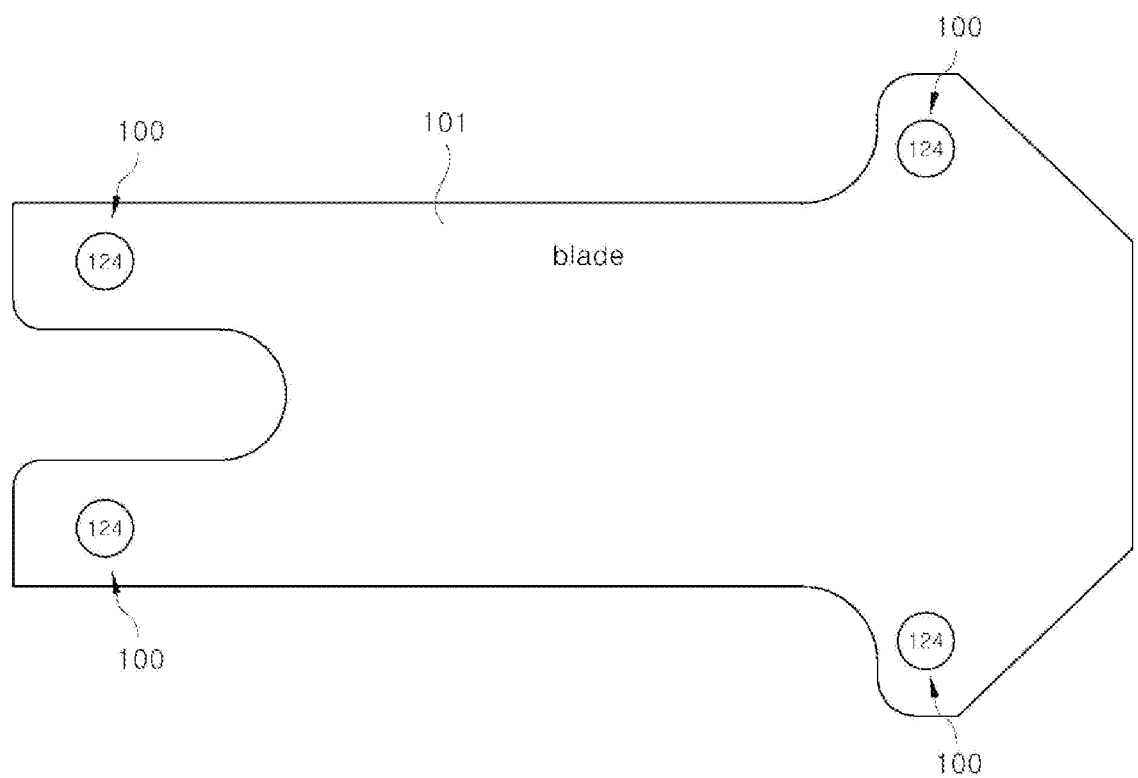
FIG. 7 illustrates the state in which the pad structure for transferring a flat panel according to an embodiment of the present invention is bonded to a blade.

FIGS. 6A-6C illustrate an example of a pad structure for transferring a flat panel according to an embodiment of the present invention, and FIG. 7 illustrates the state in which the pad structure for transferring a flat panel according to an embodiment of the present invention is bonded to a blade.

FIG. 6A illustrates an actual example in which the first adhesive tape 120 and the second adhesive tape 130 are bonded to the pad for transferring a flat panel according to the first embodiment, FIG. 6B illustrates an actual example in which the first adhesive tape 120 and the second adhesive tape 130 are bonded to the pad for transferring a flat panel according to the second embodiment and FIG. 6C illustrates an example of an actual back surface of the pad structure for transferring a flat panel in which the base plate 140 is bonded to the pad for transferring the flat panel according to the first embodiment.

FIG. 7 illustrates the state in which the pad structure for transferring a flat panel 100 is bonded to the blade 101.

The pad structure 100 for transferring the flat panel according to the present invention can be easily and simply attached or bonded to a desired position on the blade 101 freely according to the needs of production facilities or users.

Figure 8:
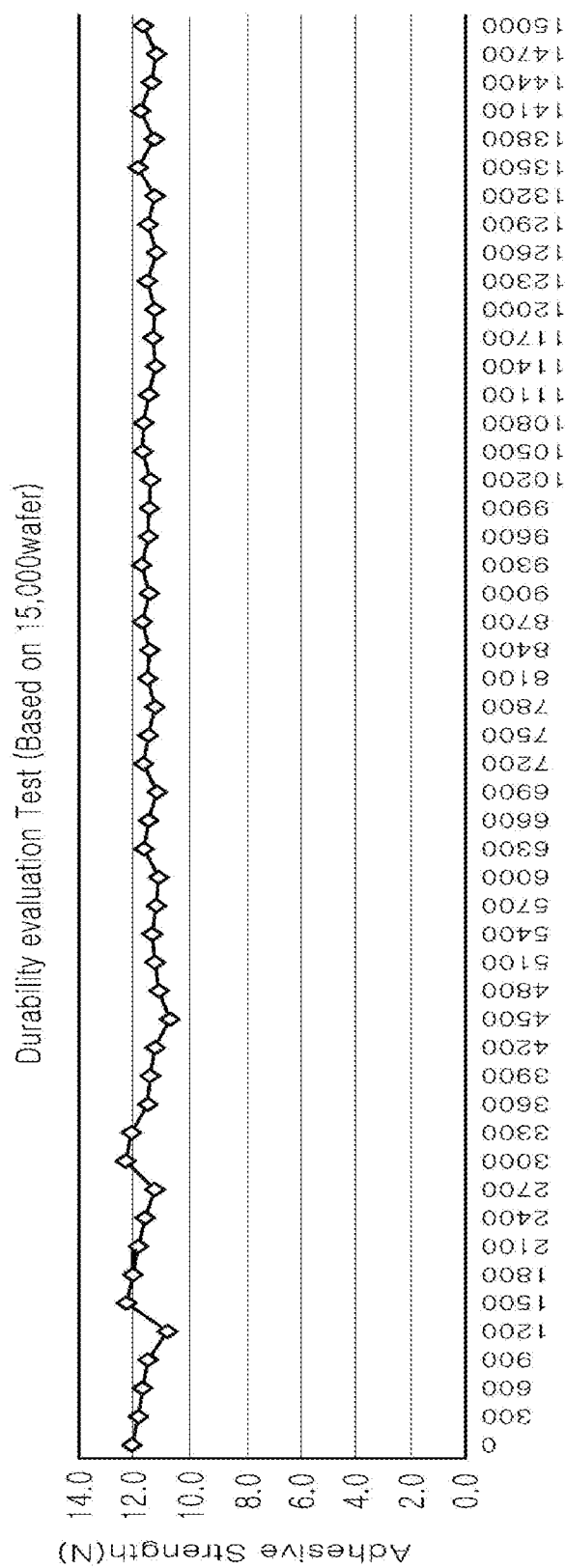
FIG. 8 illustrates an adhesion performance test of the pad structure for transferring a flat panel according to an embodiment of the present invention.
Figure 9:
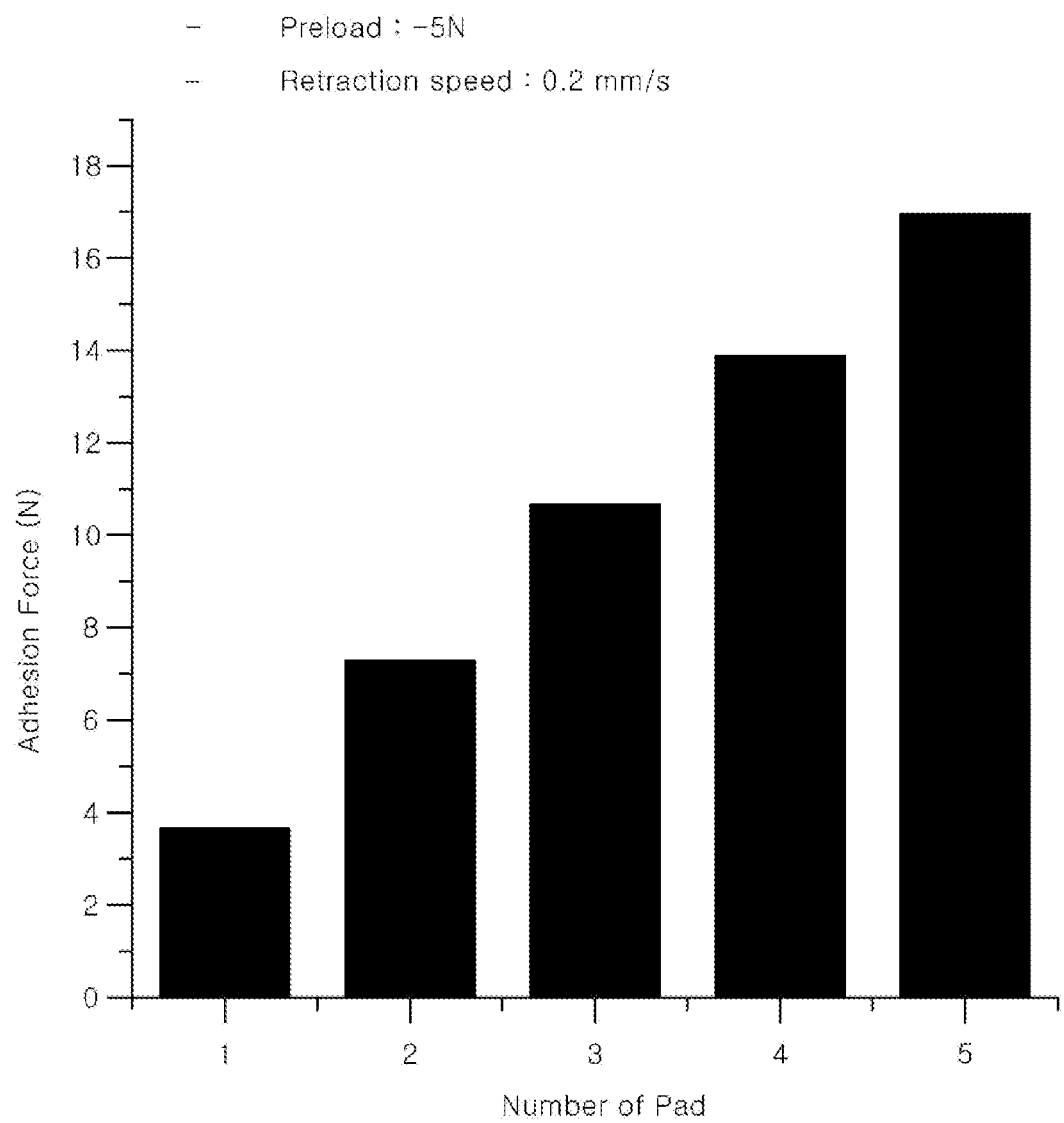
FIG. 9 illustrates a change in adhesive force as a function of the number of pad structures for transferring a flat panel according to an embodiment of the present invention.

FIG. 8 illustrates an adhesion performance test of the pad structure for transferring a flat panel according to an embodiment of the present invention, and FIG. 9 illustrates a change in adhesive force as a function of the number of pad structures for transferring a flat panel according to an embodiment of the present invention.

FIG. 8 is a graph showing the result of a durability test on the pad structure 100 for transferring the flat panel according to the present invention, performed continuously 150,000 times (The test was shown as estimated total number of operations per year, and the test was performed using only 15,000 wfs of test data. Nevertheless the behavior resulting from the values would be the same).

The strength is 450 mmHG=6 N/cm², the adhesive strength per 1 cm diameter is 1.78 N, and 5.34 N adhesive strength is formed when the three pad structures for transferring the flat panel 100 are bonded to the blade 101.

FIG. 9 illustrates a change in adhesive force depending on the number of pad structures for transferring a flat panel 100. When one pad structure for transferring a flat panel 100 is used, an adhesive force of about 4 N is generated, and when five pad structures for transferring a flat panel 100 are used, an adhesive force of about 18 N is generated.

As is apparent from the above description, the pad structure for transferring a flat panel according to the present invention has effects of increasing the adhesive force owing to the functions of the pad for transferring the flat panel and of being easily and simply attached to and detached from the blade at a desired position thereon, thereby realizing replacement and repair in a very simple manner.

The pad structure for transferring a flat panel according to the present invention has an effect of minimizing physical and chemical contamination when contacting the object to be transferred.

The pad structure for transferring a flat panel according to the present invention has an effect of minimizing physical impacts when adhered to and detached from the object to be transferred based on adjustment of adhesive force.

The present invention has an effect of maximizing productivity by preventing or minimizing the occurrence of damage, cracks, dust generation, etc. during the transfer of an object.

The present invention has an effect of maximizing productivity through easy and smooth quality control, preventive maintenance, and inventory management of the pad for transferring a flat panel based on serial number standardization (product information standardization).

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A pad structure for transferring a flat panel comprising:
   a pad for transferring a flat panel, the pad comprising a disk-shaped pad body having a diameter and height and a contact portion formed on the pad body and having an adhesive force suitable for holding the flat panel to be transferred and for enabling separation of the flat panel, wherein the flat panel is one of a semiconductor wafer and flat glass;
   a first adhesive tape having a first surface including an adhesive layer, the first surface bonded to a bottom surface of the pad body; and
   a second adhesive tape in a form of a double-sided tape comprising a first adhesive layer and a second adhesive layer on respective surfaces thereof, the first adhesive layer bonded to the first adhesive tape and the second adhesive layer configured to be bonded to a blade,
   wherein the contact portion comprises:

a first adhesive pattern having a circular shape having a diameter in a center of a top surface of the pad body and continuously flush with the top surface of the pad body; and a ciliated member having a circumferential surface surrounding the first adhesive force adjustment pattern on the top surface of the pad body, the ciliated member including a plurality of cilia spaced apart from one another to increase an adhesive force per unit area, wherein the first adhesive pattern and the ciliated member have the same height from the top surface contacting the flat panel.

2. The pad structure according to claim 1, wherein a diameter of the first adhesive pattern is determined depending on a size of the flat panel to be transferred.

3. The pad structure according to claim 1, wherein when the flat panel is a wafer having a diameter of 300 mm, a diameter of the first adhesive pattern is 2 mm, when the flat panel is a wafer having a diameter of 200 mm, the diameter of the first adhesive pattern is 3 mm, and when the flat panel is flat glass, the diameter of the first adhesive pattern is 4 mm.

4. The pad structure according to claim 1, further comprising:

a base plate having one surface bonded to the second adhesive layer of the second adhesive tape, the base plate having a height and a flat shape, and enabling flatness thereof to be adjusted by controlling a height of the pad for transferring the flat panel; and a third adhesive tape in a form of double-sided tape comprising a third adhesive layer and a fourth adhesive layer on respective surfaces thereof, the third adhesive layer bonded to one surface of the base plate, and the fourth adhesive layer configured to be bonded to the blade.

5. The pad structure according to claim 1, wherein:

the first surface of the first adhesive tape, including the adhesive layer, is attached to the bottom surface of the pad body, and product information including a serial number is printed on a second surface opposite the first surface of the first adhesive tape.

6. The pad structure according to claim 1, wherein the pad is formed of a transparent silicon-based material.

7. The pad structure according to claim 1, wherein the pad, first adhesive pattern, and the ciliated member are integrally formed from a single piece of material.

8. A pad structure for transferring a flat panel comprising:

a pad for transferring a flat panel, the pad comprising a disk-shaped pad body having a diameter and height and a contact portion formed on the pad body and having an adhesive force suitable for holding the flat panel to be transferred and for separation of the the flat panel, wherein the flat panel is one of a semiconductor wafer and flat glass;

a first adhesive tape having a first surface including an adhesive layer, the first surface bonded to a bottom surface of the pad body; and a second adhesive tape in a form of a double-sided tape comprising a first adhesive layer and a second adhesive layer on respective surfaces thereof, the first adhesive layer bonded to the first adhesive tape and the second adhesive layer configured to be bonded to a blade, wherein the contact portion comprises:

a second adhesive pattern having a circular shape having a diameter provided in a form of a depression in a center of a top surface of the pad body; and a ciliated member having a circumferential surface surrounding the second adhesive pattern on the top surface of the pad body, the ciliated member including a plurality of cilia spaced apart from one another to increase an adhesive force per unit area, wherein when the flat panel to be transferred is loaded on the pad for transferring the flat panel, a primary adhesive force is generated on the surface of the ciliated member, and at the same time, a secondary adhesive force is generated by a vacuum immediately after the air escapes from the depression of the second adhesive pattern.

9. The pad structure according to claim 8, wherein a diameter of the depression of the second adhesive pattern is determined depending on a size of the flat panel to be transferred.

10. The pad structure according to claim 8, wherein when the flat panel is a wafer having a diameter of 300 mm, a diameter of the second adhesive pattern is 2 mm, when the flat panel is a wafer having a diameter of 200 mm, the diameter of the second adhesive pattern is 3 mm, and when the flat panel is flat glass, the diameter of the second adhesive pattern is adjusted to 4 mm.

11. The pad structure according to claim 8, further comprising:

a base plate having one surface bonded to the second adhesive layer of the second adhesive tape, the base plate having a height and a flat shape, and enabling flatness thereof to be adjusted by controlling a height of the pad for transferring the flat panel; and a third adhesive tape in a form of double-sided tape comprising a third adhesive layer and a fourth adhesive layer on respective surfaces thereof, the third adhesive layer bonded to one surface of the base plate, and the fourth adhesive layer configured to be bonded to the blade.

12. The pad structure according to claim 8, wherein:

the first surface of the first adhesive tape, including the adhesive layer, is attached to the bottom surface of the pad body, and product information including a serial number is printed on a second surface opposite the first surface of the first adhesive tape.

13. The pad structure according to claim 8, wherein the pad is formed of a transparent silicon-based material.

14. The pad structure according to claim 8, wherein the pad, the first adhesive pattern, and the ciliated member are integrally formed from a single piece of material.

* * * * *